United States Patent
Lee et al.

(10) Patent No.: US 6,473,325 B2
(45) Date of Patent: Oct. 29, 2002

(54) BIT LINE SENSING CONTROL CIRCUIT FOR A SEMICONDUCTOR MEMORY DEVICE AND LAYOUT OF THE SAME

(75) Inventors: Yun-Sang Lee, Yongin (KR); Sang-Suk Kang, Suwon (KR); Jae-Hoon Joo, Yongin (KR); Jong-Eon Lee, Anyang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/882,209

(22) Filed: Jun. 15, 2001

(65) Prior Publication Data

US 2002/0057588 A1 May 16, 2002

(30) Foreign Application Priority Data

Nov. 14, 2000 (KR) .......................... 2000-67411

(51) Int. Cl.⁷ ................................. G11C 5/06
(52) U.S. Cl. .......................... 365/63; 365/208
(58) Field of Search ................... 365/63, 205, 207, 365/208, 230.06; 327/51, 57

(56) References Cited

U.S. PATENT DOCUMENTS 6,310,810 B1 * 10/2001 Jain ............................ 365/205
6,337,824 B1 * 1/2002 Kono et al. .................. 365/207
6,344,760 B1 * 2/2002 Pyo ............................. 327/51

* cited by examiner

*Primary Examiner*—David Nelms
*Assistant Examiner*—Gene N. Auduong
(74) *Attorney, Agent, or Firm*—F. Chau & Associates, LLP

(57) ABSTRACT

A layout of a bit line sensing control circuit for a semiconductor memory device includes two bit line pairs extending in a first direction. A power contact is arranged between the two bit line pairs. A power gate is arranged around the power contact. A plurality of sense transistors respectively have a plurality of sense transistor gates. The plurality of sense transistor gates are arranged around the power gate. A pair of control line contacts is arranged in a second direction at an adjacent location outside the two bit line pairs. A control line extends in the second direction and is connected to the power gate through the pair of control line contacts. A power line extends in the second direction adjacent to the control line and is connected to an active area surrounded by the power gate through the power contact.

19 Claims, 10 Drawing Sheets

(Lumped Type Power Gate)

(Distributed Type Power Gate)

BIT LINE SENSING CONTROL CIRCUIT FOR A SEMICONDUCTOR MEMORY DEVICE AND LAYOUT OF THE SAME

BACKGROUND

1. Technical Field

The present invention relates generally to semiconductor devices and, in particular, to a bit line sensing control circuit for a semiconductor memory device and a layout of the same.

2. Background Description

The chip size of a semiconductor memory device is one of the most important parameters regarding product competitiveness. Up to now, a significant amount of research has been undertaken and corresponding developments obtained to reduce a memory chip size, with a focus on fine line width and optimum circuit layout.

FIG. 1 is a circuit diagram illustrating a conventional bit line sensing control circuit. The bit line sensing control circuit includes equalizer circuits 10 and 20, isolation circuits 12 and 22, sense amplifier circuits 14 and 24, a column select line (CSL) gate 16, and power switching circuits 18 and 28.

The equalizer circuits 10 and 20 serve to pre-charge bit lines to a VDD/2 level when a cell connected to the bit line is non-activated. This is to enable cell data "0" and "1" to have the same charge distribution margin when the cell is later activated, and then the bit lines are charge-distributed by the cell data.

The isolation circuits 12 and 22 connect the bit line sensing control circuit with selected memory cell array blocks and isolate the bit line sensing control circuit from non-selected memory cell array blocks when the bit line sensing control is connected with a plurality of memory cell array blocks, so as to minimize a load of a bit line during a bit line sensing operation.

The sense amplifier circuits 14 and 24 typically include N/P MOS type sense amplifier pairs and have a symmetrical configuration to maximize, for example, read and write characteristics of a memory chip. The sense amplifier circuits 14 and 24 amplify bit line data of tens to hundreds of millivolts (mV) that are charge-distributed to a CMOS level.

The CSL gate 16 is a gate that switches a bit line and an I/O line. The CSL gate 16 transfers data from a sensed bit line to a data line and transfers input data from an outside of a memory chip to a bit line. Also, the CSL gate 16 is a key component that decides read and write characteristics of a memory chip.

The power switching circuits 18 and 28 supply an electrical power to the sense amplifier circuits 14 and 24, respectively.

FIG. 2 is a plan layout view illustrating a layout structure of the conventional bit line sensing control circuit of FIG. 1. The equalizer circuits 10 and 20 are respectively located opposite end portions of the bit line sensing control circuit adjacent to the memory cell array. The isolation circuits 12 and 22 are located adjacent to the equalizer circuits 10 and 20 so that the bit line sensing control circuit may be connected with just selected memory cell array blocks. The CSL gate 16 is located on a central portion of the bit line sensing control circuit. Centered with respect to the CSL gate 16, the N/P MOS type sense amplifier circuits 14 and 24 and the power switching circuits 18 and 28 are symmetrically arranged.

In sensing the cell data, the most important components of the bit line sensing control circuits are the N/P MOS type sense amplifiers 14 and 24 and the power switching circuits 18 and 28. A stable and smooth sensing operation depends on the layout of these two types of circuits. Therefore, the layout of the N/P MOS sense amplifier circuits 14 and 24 has been designed in consideration of a load (e.g., a resistance) mismatch of a bit line and a bit line bar.

However, with respect to the power switching circuits, for example, in the case of a conventional lump type power switching circuit as shown in FIG. 3, a problem may occur in that a sufficient amount of a power may not be supplied at an appropriate time(s), according to a position of the sense amplifier. Also, in the case of a conventional distribute type power switching circuit as shown in FIG. 4, since the power switching circuit and the sense amplifier are connected with each other by a contact, a contact resistance may vary according to a manufacturing process. Therefore, it becomes very difficult to secure a stable and smooth sensing operation.

For at least the foregoing reasons, there is a need for a bit line sensing control circuit for a semiconductor memory device and a layout of the same, whereby the circuit and layout provide a stable and smooth sensing operation.

SUMMARY OF THE INVENTION

The problems stated above, as well as other related problems of the prior art, are solved by the present invention, a bit line sensing control circuit and a bit line sensing control circuit layout for a semiconductor memory device.

Advantageously, the bit line sensing control circuit (and layout) according to the present invention provides a smooth, stable, and high speed sensing operation. By arranging a power transistor inside a sense amplifier to have a sufficient capacity, the sensing speed of the bit line sensing control circuit can be improved. Also, since the power transistor is arranged inside the sense amplifier, the layout area of the bit line sensing control circuit can be reduced, and a layout efficiency of the bit line sensing control circuit can be improved. Moreover, since a load mismatch between an NMOS sense amplifier and a column sense transistor is prevented, an initial sensing operation becomes stable and smooth.

According to an aspect of the present invention, there is provided a layout of a bit line sensing control circuit for a semiconductor memory device. The layout includes two bit line pairs extending in a first direction. A power contact is arranged between the two bit line pairs. A power gate is arranged around the power contact. A plurality of sense transistors respectively have a plurality of sense transistor gates. The plurality of sense transistor gates are arranged around the power gate. A pair of control line contacts is arranged in a second direction at an adjacent location outside the two bit line pairs. A control line extends in the second direction and is connected to the power gate through the pair of control line contacts. A power line extends in the second direction adjacent to the control line and, is connected to an active area surrounded by the power gate through the power contact.

According to another aspect of the present invention, opposite sides of the power line and the control line respectively form a convex shape and a concave shape.

According to yet another aspect of the present invention, the plurality of sense transistors are PMOS transistors, and the plurality of gates of the PMOS transistors have a letter "L" shape.

According to still yet another aspect of the present invention, the plurality of sense transistors are NMOS transistors, and the plurality of gates of the NMOS transistors have a letter "D" shape.

According to an additional aspect of the present invention, there is provided a bit line sensing control circuit for a semiconductor memory device. The bit line sensing control circuit includes first and second bit line pairs extending in a first direction. Each of the pairs have first and second bit lines. A power contact is arranged between the first and second bit line pairs. A power gate is arranged around the power contact. A first sense transistor is arranged adjacent to an upper-left side of the power gate. The first sense transistor has a gate connected to the first bit line of the first bit line pair, a drain connected to the second bit line of the first bit line pair and a source connected to the power contact through the power gate. A second sense transistor is arranged adjacent to an upper-right side of the power gate. The second sense transistor has a gate connected to the second bit line of the first bit line pair, a drain connected to the first bit line of the first bit line pair and a source connected to the power contact through the power gate. A third sense transistor is arranged adjacent to a lower-left side of the power gate. The third sense transistor has a gate connected to the first bit line of the second bit line pair, a drain connected to the second bit line of the second bit line pair and a source connected to the power contact through the power gate. A fourth sense transistor is arranged adjacent to a lower-right side of the power gate. The fourth sense transistor has a gate connected to the second bit line of the second bit line pair, a drain connected to the first bit line of the second bit line pair and a source connected to the power contact through the power gate. A pair of control line contacts is arranged in a second direction at an adjacent location outside the first and second bit line pairs to be juxtaposed to the power contact. A control line extends in the second direction and is connected to the power gate through the pair of control line contacts. A power line extends in the second direction adjacent to the control line and is connected to an active area surrounded by the power gate through the power contact.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
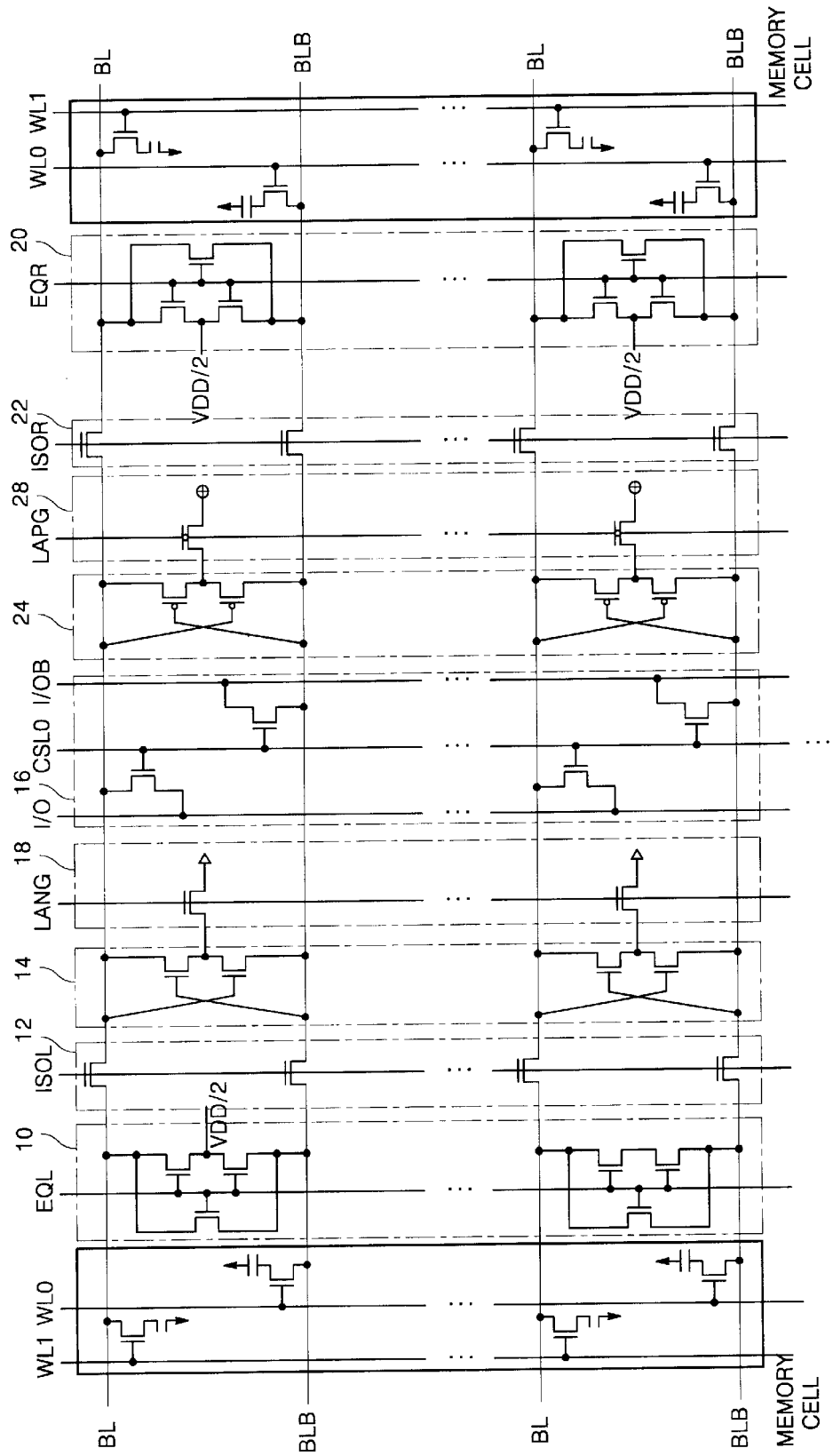
FIG. 1 is a circuit diagram illustrating a conventional bit line sensing control circuit.
Figure 2:
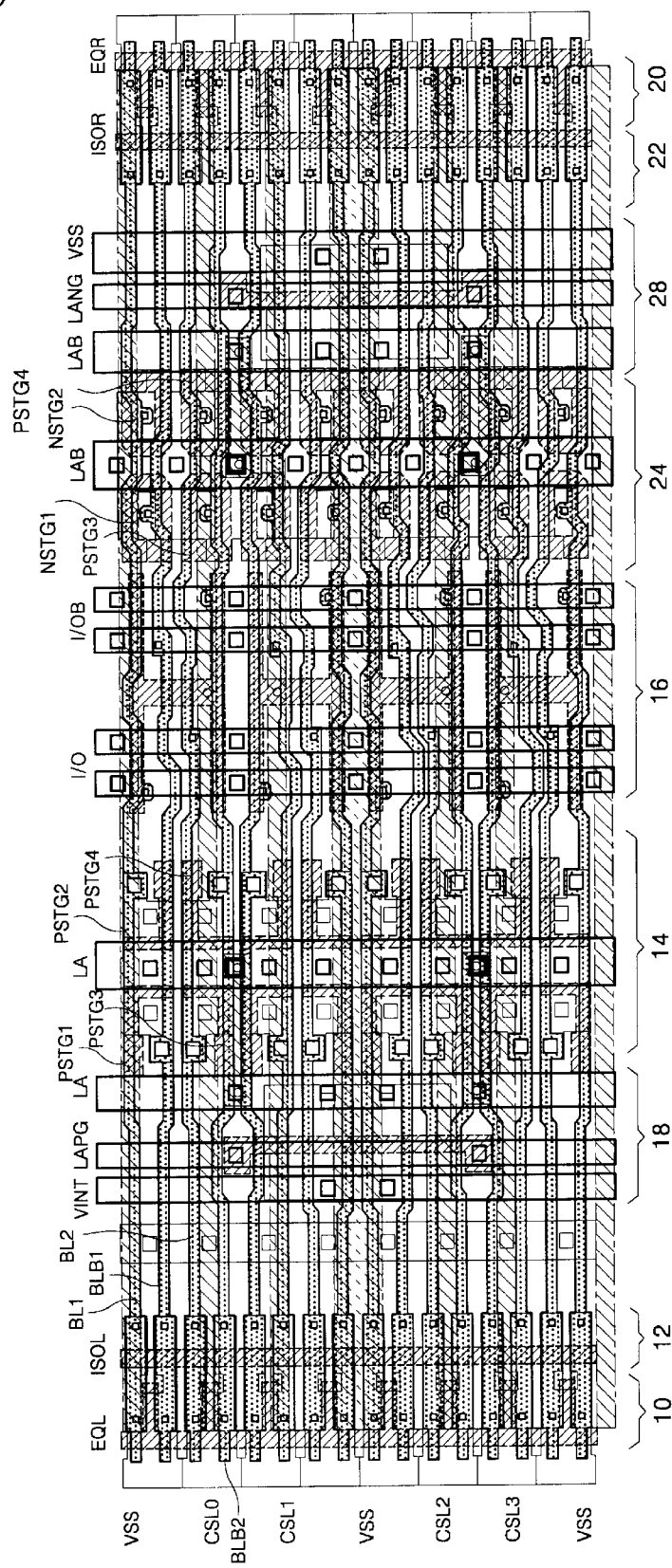
FIG. 2 is a plan layout view illustrating a layout structure of the conventional bit line sensing control circuit of FIG. 1.
Figure 3:
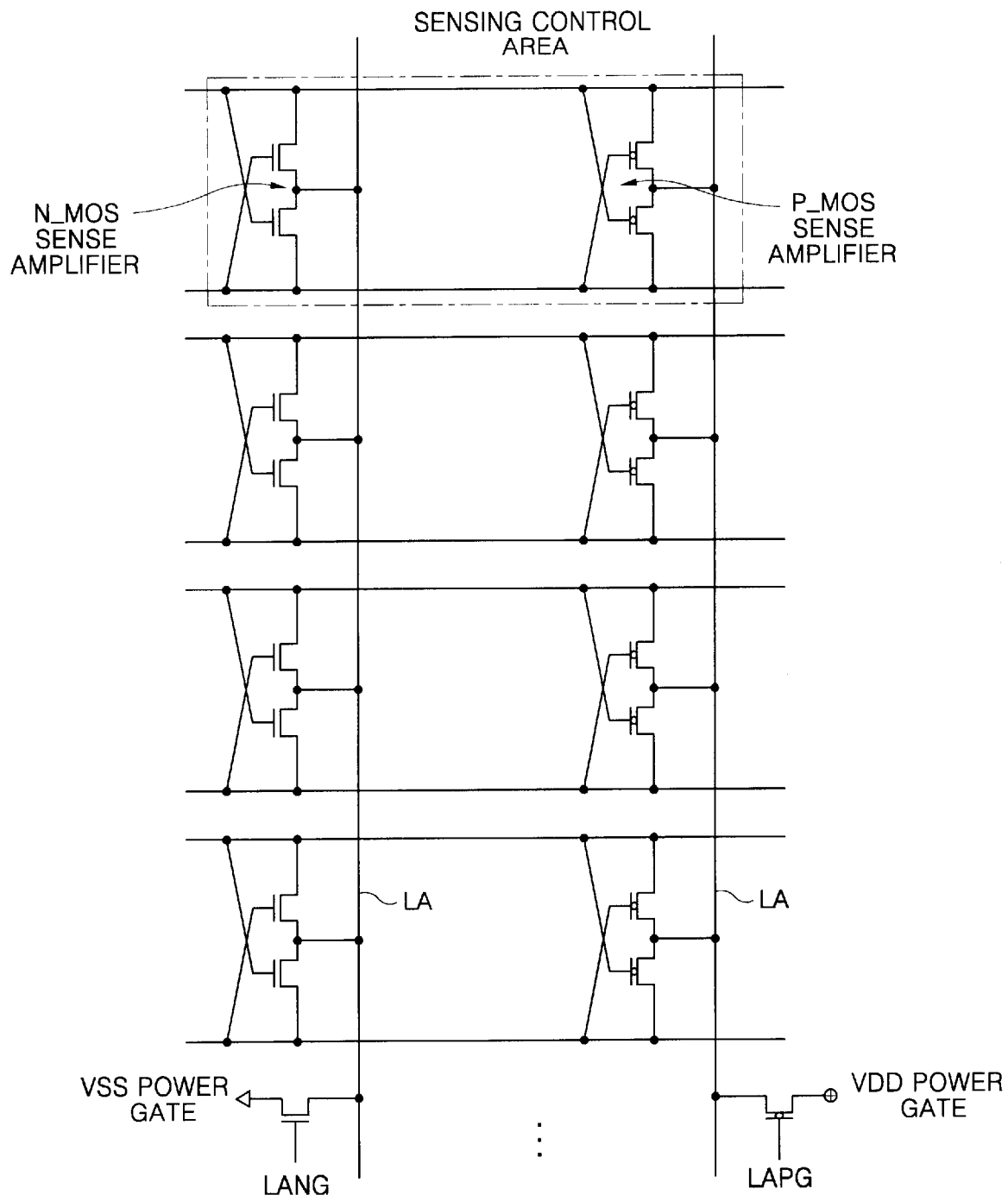
FIG. 3 is a circuit diagram illustrating a conventional lump type power switching circuit.
Figure 4:
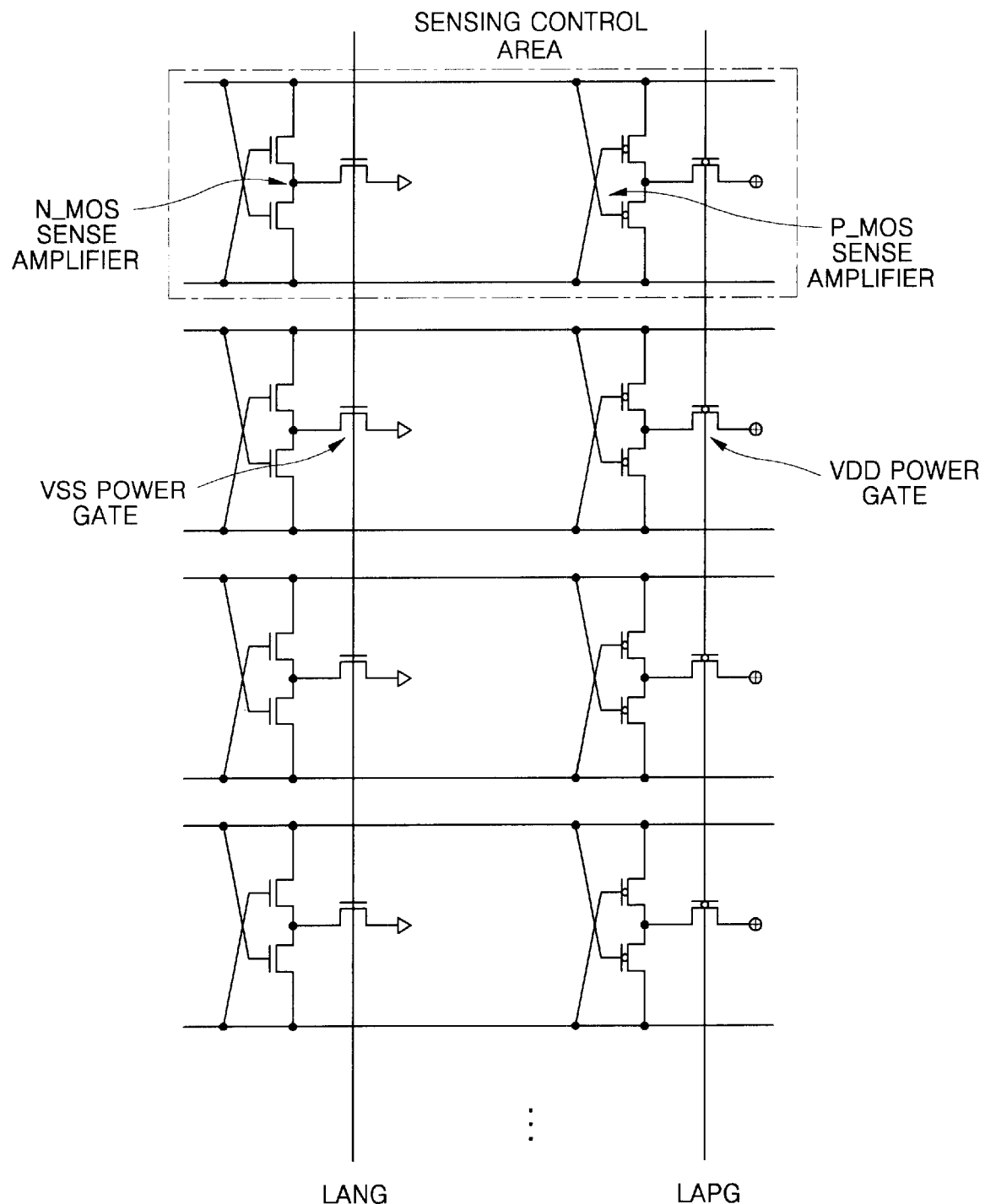
FIG. 4 is a circuit diagram illustrating a conventional distribute type power switching circuit.
Figure 5:
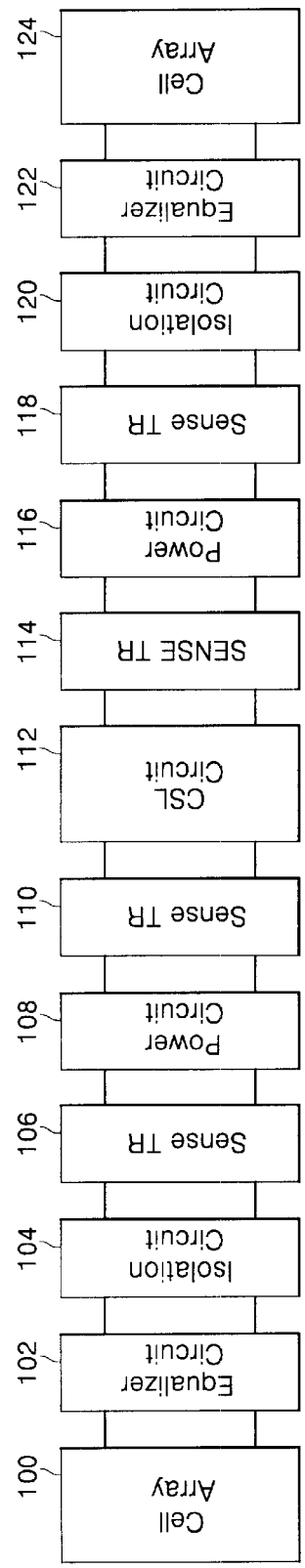
FIG. 5 is a block diagram illustrating a configuration of a bit line sensing control circuit according to an illustrative embodiment of the present invention.

FIG. 5 is a block diagram illustrating a configuration of a bit line sensing control circuit according to an illustrative embodiment of the present invention. The bit line sensing control circuit includes: a first equalizer circuit 102; a first isolation circuit 104; a first PMOS sense transistor 106; a first power transistor 108; a second PMOS sense transistor 110; a CSL circuit 112; a first NMOS sense transistor 114; a second power transistor 116; a second NMOS sense transistor 118; a second isolation circuit 120; and a second equalizer circuit 122. The preceding elements of the bit line sensing control circuit are arranged in the above described order along bit line pair BL and BLB (see FIG. 6). In contrast with the conventional bit line sensing control circuit of FIG. 1, the power transistors of the bit line sensing control circuit of FIG. 5 are arranged between the sense transistors.

Figure 6:
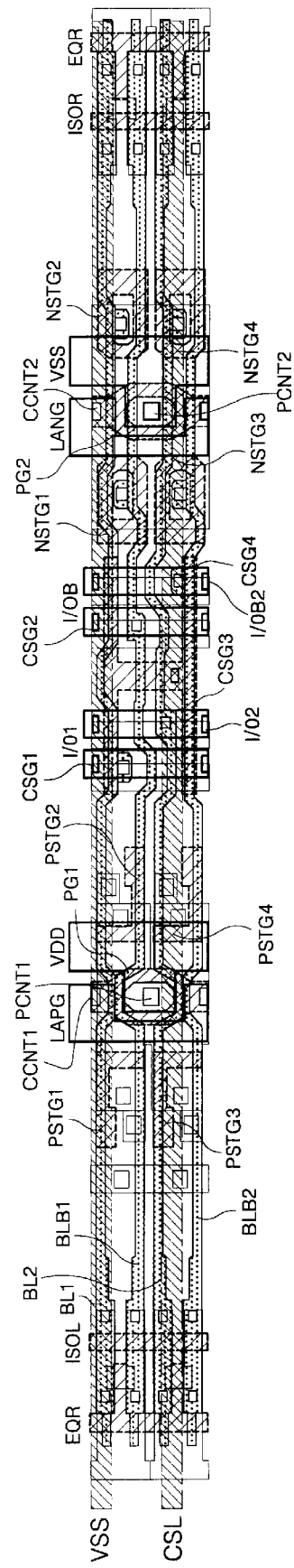
FIG. 6 is a diagram illustrating a layout of the bit line sensing control circuit of FIG. 5, according to an illustrative embodiment of the present invention.

FIG. 6 is a diagram illustrating a layout of the bit line sensing control circuit of FIG. 5, according to an illustrative embodiment of the present invention. The bit line sensing control circuit has the following, five layer structure: an active area defined by a fine solid line; a gate having hatches of 45 degrees; a bit line defined by a dotted line; a first metal line having hatches of –45 degrees; and a second metal line defined by a bold solid line. In the PMOS sense amplifier, a power gate PG1 of the power transistor has a polygon shape with a closed curve (e.g., a letter "O" on shape or an octagon shape), and is arranged between the two bit line pairs BL1 and BLB1, and BL2 and BLB2. Gates PSTG1, PSTG2, PSTG3, and PSTG4 of the sense transistor have a letter "L" shape, and are arranged on a periphery region of the power gate PG1. Therefore, the power transistor and the sense transistor share the active region between the power gate PG1 and the gates PSTG1, PSTG2, PSTG3, and PSTG4 of the sense transistor as a source/drain region.

A sensing control line LAPG and a power line VDD include the five layer second metal line, and are arranged on the power gate PG1 in a perpendicular direction to the bit line. The power line VDD is connected to the active area surrounded by the "O" shaped power gate through a power contact PCNT1. The sensing control line LAPG is connected with the power gate PG1 through two control line contacts CCNT1 that are disposed at respective locations adjacent to an upper outline region of the bit line pair BL1 and BLB1 and adjacent to a lower outline region of the bit line pair BL2 and BLB2 (i.e., at two end portions of an imaginary perpendicular line that passes through the power contact PCNT1). Therefore, opposite sides of the sensing control line LAPG and the power line VDD respectively form concave and convex shapes that are engaged with each other.

In the NMOS sense amplifier, a power gate PG2 of the power transistor has a polygon shape with a closed curve (e.g., a letter "O" shape or an octagon shape), and is arranged between the two bit line pairs BL1 and BLB1, and BL2 and BLB2. Gates NSTG1, NSTG2, NSTG3, and NSTG4 of the sense transistor have a letter "D" shape, and are arranged on a periphery region of the power gate PG2. Therefore, the power transistor and the sense transistor share the active region between the power gate PG2 and the gates NSTG1, NSTG2, NSTG3, and NSTG4 of the sense transistor as a source/drain region.

A sensing control line LANO and a power line VSS include the five layer second metal line, and are arranged on the power gate PG2 in a perpendicular direction to the bit line. The power line VSS is connected to the active area encircled by the "O" shaped power gate PG2 through a power contact PCNT2. The sensing control line LANG is connected with the power gate PG2 through two control line contacts CCNT2 that are disposed at respective locations adjacent to an upper outline region of the bit line pair BL1 and BLB1 and adjacent to a lower outline region of the bit line pair BL2 and BLB2 (i.e., at two end portions of an imaginary perpendicular line that passes through the power contact PCNT2). Therefore, opposite sides of the sensing control line LANG and the power line VSS respectively form concave and convex shapes that are engaged with each other.

Figure 7:
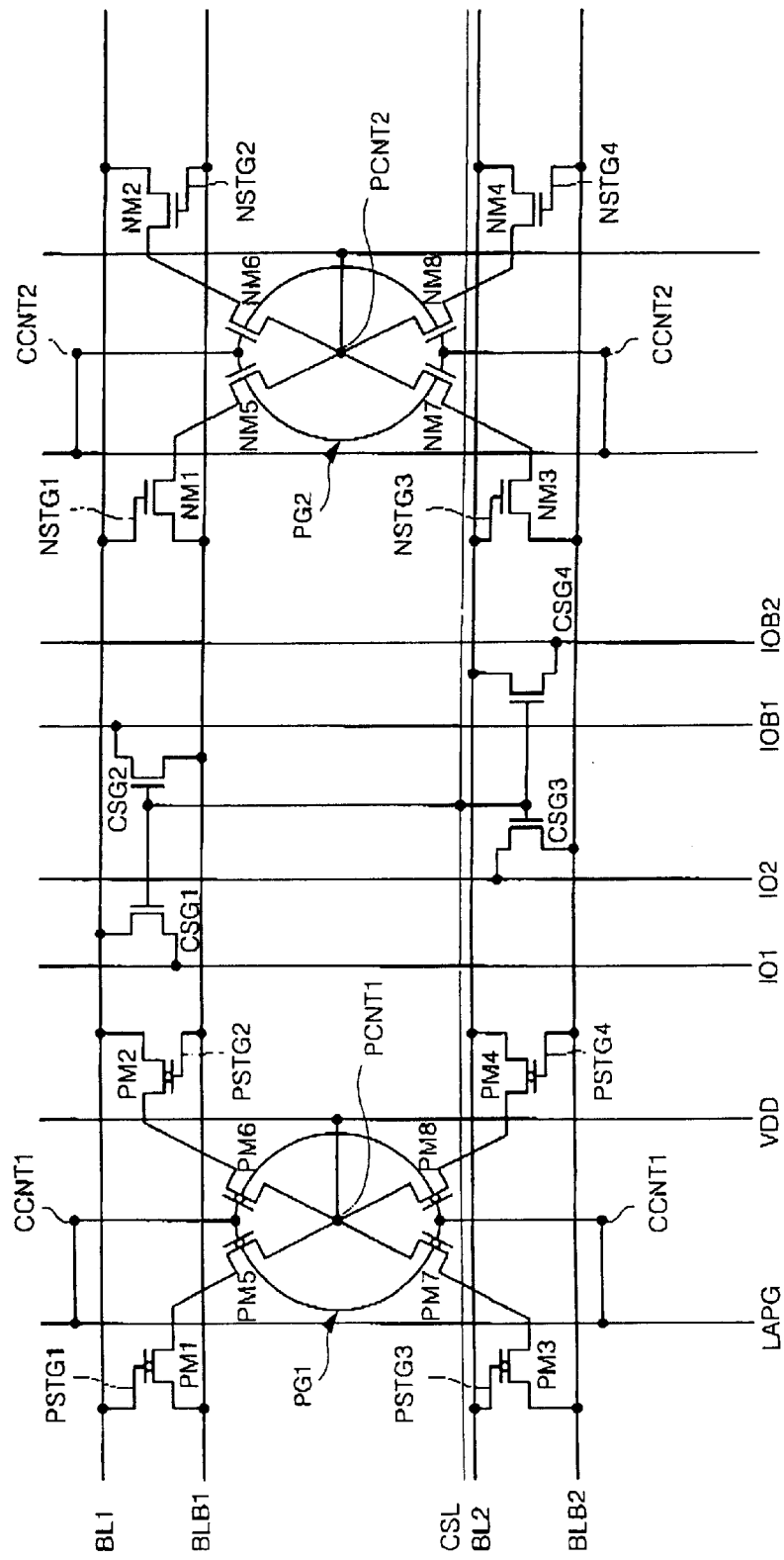
FIG. 7 is an equivalent circuit of FIG. 6, according to another illustrative embodiment of the present invention.

Referring to FIG. 7, the PMOS sense amplifier circuit connected with the bit line pair BL1 and BLB1 includes sense transistors PM1 and PM2. The sense transistor PM1 is arranged at a location adjacent to an upper-left side of the power gate PG1. The sense transistor PM1 includes a gate connected to the bit line BL1, a drain connected to the bit line BLB1, and a source connected to the power contact PCNT1 through a power transistor PM5. The sense transistor PM2 is arranged at a location adjacent to an upper-right side of the power gate PG1. The sense transistor PM2 includes a gate connected to the bit line BLB1, a drain connected to the bit line BL1, and a source connected to the power contact PCNT1 through a power transistor PM6.

The PMOS sense amplifier circuit connected with the bit line pair BL2 and BLB2 includes sense transistors PM3 and PM4. The sense transistor PM3 is arranged at a location adjacent to a lower-left side of the power gate PG1. The sense transistor PM3 includes a gate connected to the bit line BL2, a drain connected to the bit line BLB2, and a source connected to the power contact PCNT1 through a power transistor PM7. The sense transistor PM4 is arranged at a location adjacent to a lower-right side of the power gate PG1. The sense transistor PM4 includes a gate connected to the bit line BLB2, a drain connected to the bit line BL2, and a source connected to the power contact PCNT1 through a power transistor PM8.

The NMOS sense amplifier circuit connected with the bit line pair BL1 and BLB1 includes sense transistors NM1 and NM2. The sense transistor NM1 is arranged at a location adjacent to an upper-left side of the power gate PG2. The sense transistor NM1 includes a gate connected to the bit line BL1, a drain connected to the bit line BLB1, and a source connected to the power contact PCNT2 through a power transistor NM5. The sense transistor NM2 is arranged at a location adjacent to an upper-right side of the power gate PG2. The sense transistor NM2 includes a gate connected to the bit line BLB1, a drain connected to the bit line BL1, (and a source connected to the power contact PCNT2 through a power transistor NM6.

The NMOS sense amplifier circuit connected with the bit line pair BL2 and BLB2 includes sense transistors NM3 and NM4. The sense transistor NM3 is arranged at a location adjacent to a lower-left side of the power gate PG2. The sense transistor NM3 includes a gate connected to the bit line BL2, a drain connected to the bit line BLB2, and a source connected to the power contact PCNT2 through a power transistor NM7. The sense transistor NM4 is arranged at a location adjacent to a lower-right side of the power gate PG2. The sense transistor NM4 includes a gate connected to the bit line BLB2, a drain connected to the bit line BL2, and a source connected to the power contact PCNT2 through a power transistor NM8.

Two I/O line pairs IO1 and IOB1, and IO2 and IOB2 are arranged between the PMOS sense amplifiers and the NMOS sense amplifiers in a perpendicular direction to the bit lines. The I/O line pair IO1 and IOB1 is connected with the bit line pair BL1 and BLB1 through column select transistors CSGL and CSG2. The I/O line pair IO2 and IOB2 is connected with the bit line pair BL2 and BLB2 through column select transistors CSG3 and CSG4. Gates of the column select transistors CSG1, CSG2, CSG3, and CSG4 are connected to a column select line CSL.

In the bit line sensing control circuit having a configuration as described above, since the power contact is formed between the two bit line pairs and between the two sense transistors, the four sense transistors are symmetrically formed centered on the power contact. That is, distances from respective sense transistors to the power contact are all equal, whereupon the same amount of power is supplied to the four sense transistors. Also, a sufficient amount of power can be supplied without additional components. For example, in case of a 128 MB-DRAM, the sensing speed can be improved by about 1 ns to about 2 ns.

Moreover, since the power contact is arranged among the four sense transistors, the area size occupied by the power switching circuit can be minimized, whereby a layout area of the bit line sensing control circuit can be reduced.

Figure 8:
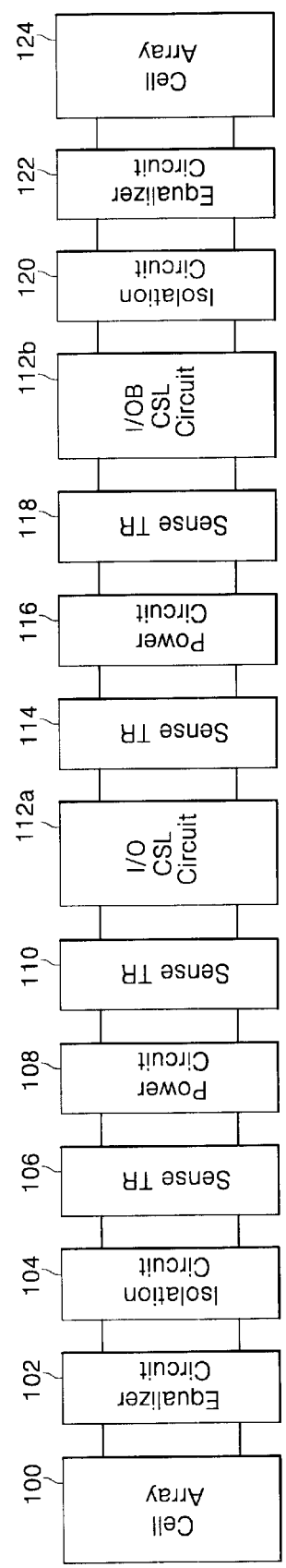
FIG. 8 is a block diagram illustrating a modified configuration of the bit line sensing control circuit of FIG. 5, according to an illustrative embodiment of the present invention.
Figure 9:
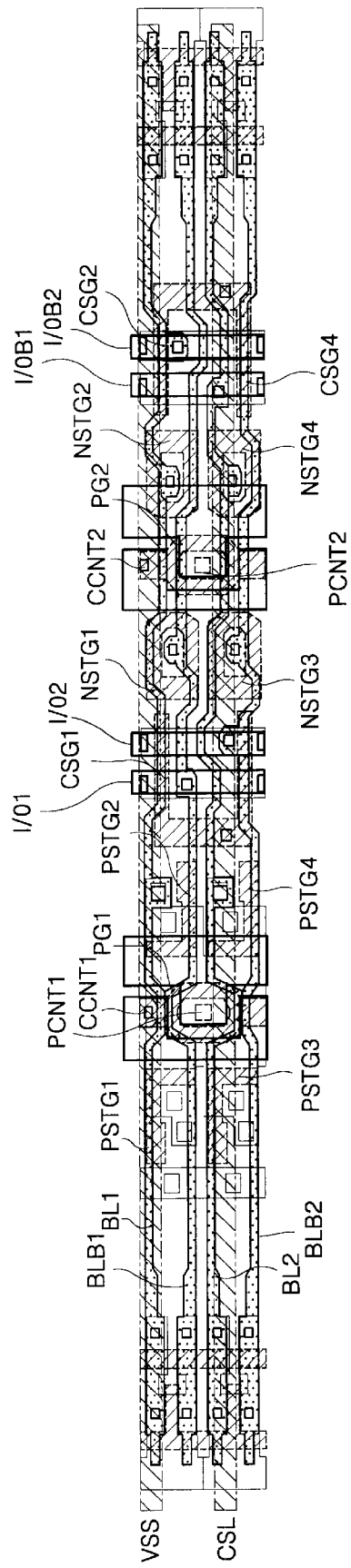
FIG. 9 is a diagram illustrating a layout of the modified configuration of the bit line sensing control circuit of FIG. 8, according to an illustrative embodiment of the present invention.
Figure 10:
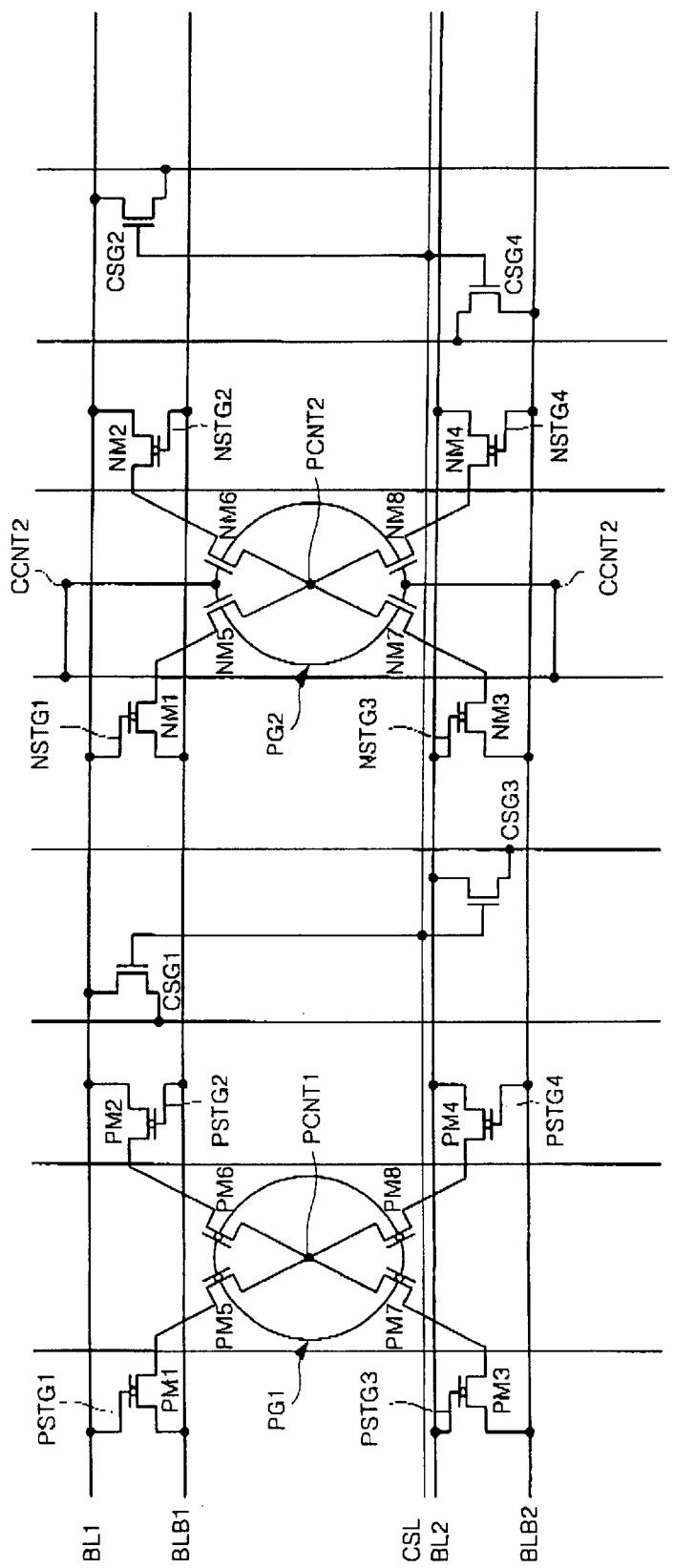
FIG. 10 is an equivalent circuit of FIG. 9, according to another illustrative embodiment of the present invention.

FIG. 8 is a block diagram illustrating a modified configuration of the bit line sensing control circuit of FIG. 5, according to an illustrative embodiment of the present invention. FIG. 9 is a diagram illustrating a layout of the modified configuration of the bit line sensing control circuit of FIG. 8, according to an illustrative embodiment of the present invention. FIG. 10 is an equivalent circuit of FIG. 9, according to another illustrative embodiment of the present invention.

Except for an arrangement of I/O lines and column select transistors, the bit line sensing control circuit of FIG. 8 has the same configuration as that of FIG. 5. In more detail, I/O lines IOB1 and IOB2 are arranged between an NMOS sense amplifier 118 and an isolation circuit 120 differently from those of FIG. 5, while I/O lines IO1 and IO2 are arranged between a PMOS sense amplifier 110 and an NMOS sense amplifier 114 "as is".

Generally, an initial sensing operation depends on the NMOS sense amplifier. However, conventional memory devices do not always provide a sufficient bit line sensing time to implement a high speed sensing operation and, thus, bit line data may be transferred to the I/O line through the CSL gate. At that moment, even a slight load mismatch may result in severe characteristic deterioration.

To prevent characteristic deterioration due to such a load mismatch, the bit line sensing control circuit of FIG. 8 maintains loads between respective nodes of the NMOS sense amplifier, the power switching circuit and the CSL gate to be same, so that an initial sensing operation becomes stable and smooth.

As described hereinbefore, the bit line sensing control circuit according to the present invention has the following advantages. First, since the power transistor is arranged inside the sense amplifier to have a sufficient capacity, the sensing speed can be improved. Also, since the power transistor is arranged inside the sense amplifier, a layout area of the bit line sensing control circuit can be reduced, and a layout efficiency of the bit line sensing control circuit can be improved. Moreover, since a load mismatch between the NMOS sense amplifier and the column sense transistor is prevented, an initial sensing operation becomes stable and smooth.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A layout of a bit line sensing control circuit for a semiconductor memory device, the layout comprising:
   two bit line pairs extending in a first direction;
   a power contact arranged between the two bit line pairs;
   a power gate arranged around the power contact;
   a plurality of sense transistors respectively having a plurality of sense transistor gates, the plurality of sense transistor gates being arranged around the power gate;
   a pair of control line contacts arranged in a second direction at an adjacent location outside the two bit line pairs;
   a control line extending in the second direction and connected to the power gate through the pair of control line contacts; and
   a power line extending in the second direction adjacent to the control line and connected to an active area surrounded by the power gate through the power contact.

2. The layout of claim 1, wherein opposite sides of the power line and the control line respectively form a convex shape and a concave shape.

3. The layout of claim 1 wherein the plurality of sense transistors are PMOS transistors, and the plurality of sense transistor gates have a letter "L" shape.

4. The layout of claim 1, wherein the plurality of sense transistors are NMOS transistors, and the plurality of sense transistor gates have a letter "D" shape.

5. A bit line sensing control circuit for a semiconductor memory device, comprising:
   first and second bit line pairs extending in a first direction, each of the first and second bit line pairs having first and second bit lines;
   a power contact arranged between the first and second bit line pairs;
   a power gate arranged around the power contact;
   a first sense transistor arranged adjacent to an upper-left side of the power gate, having a gate connected to the first bit line of the first bit line pair, a drain connected to the second bit line of the first bit line pair and a source connected to the power contact through the power gate;
   a second sense transistor arranged adjacent to an upper-right side of the power gate, having a gate connected to the second bit line of the first bit line pair, a drain connected to the first bit line of the first bit line pair and a source connected to the power contact through the power gate;
   a third sense transistor arranged adjacent to a lower-left side of the power gate, having a gate connected to the first bit line of the second bit line pair, a drain connected to the second bit line of the second bit line pair and a source connected to the power contact through the power gate;
   a fourth sense transistor arranged adjacent to a lower-right side of the power gate, having a gate connected to the second bit line of the second bit line pair, a drain connected to the first bit line of the second bit line pair and a source connected to the power contact through the power gate;
   a pair of control line contacts arranged in a second direction at an adjacent location outside the first and second bit line pairs to be juxtaposed to the power contact;
   a control line extending in the second direction and connected to the power gate through the pair of control line contacts; and
   a power line extending in the second direction adjacent to the control line and connected to an active area surrounded by the power gate through the power contact.

6. A bit line sensing control circuit for a semiconductor memory device, comprising:
   at least two sense transistors; and
   at least one power transistor disposed between said at least two sense transistors, for providing an electrical power to said at least two sense transistors,
   at least two pairs of bit lines,
   wherein the at least one power transistor is disposed between the at least two pairs of bit lines.

7. The bit line sensing control circuit according to claim 6, wherein said at least one power transistor has a power gate with a polygon shape.

8. The bit line sensing control circuit according to claim 7, wherein the polygon shape is one of a letter "O" or an octagon shape.

9. The bit line sensing control circuit according to claim 7, wherein said at least two sense transistors are PMOS transistors respectively having gates with a letter "L" shape.

10. The bit line sensing control circuit according to claim 9, wherein the gates of said at least two sense transistors are arranged on a periphery region of the power gate of said at least one power transistor.

11. The bit line sensing control circuit according to claim 10, wherein the at least one power transistor and the at least two sense transistors share an active region between the power gate of said at least one power transistor and the gates of said at least two sense transistors as a source/drain region.

12. The bit line sensing control circuit according to claim 7, wherein said at least two sense transistors are NMOS transistors respectively having gates with a letter "D" shape.

13. The bit line sensing control circuit according to claim 12, wherein the gates of said at least two sense transistors are arranged on a periphery region of the power gate of said at least one power transistor.

14. The bit line sensing control circuit according to claim 13, wherein the at least one power transistor and the at least two sense transistors share an active region between the power gate of said at least one power transistor and the gates of said at least two sense transistors as a source/drain region.

15. The bit line sensing control circuit according to claim 7, further comprising:

a sensing control line;

two control line contacts for coupling the sensing control line to the power gate;

a power line; and a power contact for coupling the power line to the power gate.

16. The bit line sensing control circuit according to claim 15, wherein opposing ends of the sensing control line and the power line form engaging convex and concave shapes.

17. The bit line sensing control circuit according to claim 6, wherein said at least one power transistor is symmetrically disposed between said at least two sense transistors.

18. The bit line sensing control circuit according to claim 6, wherein the at least one power transistor includes two power transistors.

19. The bit line sensing control circuit according to claim 18, wherein drain terminals of the two sense transistors are connected to corresponding drain terminals of the two power transistors.

* * * * *